(12) United States Patent
Li et al.

(10) Patent No.: US 10,557,883 B2
(45) Date of Patent: Feb. 11, 2020

(54) LEAKAGE CURRENT DETECTION AND PROTECTION DEVICE FOR POWER CORD

(71) Applicant: Chengli Li, Suzhou (CN)

(72) Inventors: Chengli Li, Suzhou (CN); Shengyun Nie, Suzhou (CN)

(73) Assignee: Chengli Ll, Suzhou (CN)

( * ) Notice: Subject to any disclaimer, the term of this patent is extended or adjusted under 35 U.S.C. 154(b) by 379 days.

(21) Appl. No.: 15/718,661

(22) Filed: Sep. 28, 2017

(65) Prior Publication Data

US 2019/0097412 A1    Mar. 28, 2019

(30) Foreign Application Priority Data

Sep. 22, 2017  (CN) .......................... 2017 1 0864829
Sep. 22, 2017  (CN) ..................... 2017 2 1222432 U (51) Int. Cl.
| | |
|---|---|
| *H02H 3/00* | (2006.01) |
| *G01R 31/02* | (2006.01) |
| *H02H 3/04* | (2006.01) |
| *H02H 3/16* | (2006.01) |
| *H02H 3/14* | (2006.01) |
| *H02H 7/20* | (2006.01) |
| *H02H 1/00* | (2006.01) |
| *H02H 9/04* | (2006.01) |

(52) U.S. Cl.
CPC ......... *G01R 31/025* (2013.01); *H02H 1/0084* (2013.01); *H02H 3/044* (2013.01); *H02H 3/14* (2013.01); *H02H 3/16* (2013.01); *H02H 3/162* (2013.01); *H02H 7/20* (2013.01); *G01R 31/026* (2013.01); *H02H 9/041* (2013.01)

(58) Field of Classification Search
None
See application file for complete search history.

(56) References Cited

U.S. PATENT DOCUMENTS

| | | | | |
|---|---|---|---|---|
| 4,707,759 A * | 11/1987 | Bodkin | ..................... | H02H 3/16 361/102 |
| 5,708,364 A * | 1/1998 | Vokey | .................. | G01R 31/021 324/523 |
| 8,605,402 B2 * | 12/2013 | Ward | ..................... | G01K 3/005 361/103 |
| 9,331,582 B2 * | 5/2016 | Goerke | ............. | H02M 3/33507 |

(Continued)

*Primary Examiner* — Stephen W Jackson
(74) *Attorney, Agent, or Firm* — Chen Yoshimura LLP (57) ABSTRACT

A power cord leakage current detection and protection device, including a switch unit configured to control an electrical connection between an input end and an output end of the device; a leakage current protection unit, which includes a switch drive module and a leakage current detection module, the switch drive module configured to control the switch unit based on a leakage current signal detected by the leakage current detection module, wherein the leakage current detection module includes a leakage current detection line configured to detect whether a leakage current is present on a first power supply line and/or a second power supply line, and a signal feedback line configured to detect whether the leakage current detection line has an open circuit; and a test unit, including a test switch, coupled to the a leakage current protection unit, wherein when the test switch is closed, the switch drive module controls the switch unit based on a signal on the signal feedback line.

11 Claims, 10 Drawing Sheets

(56) References Cited

U.S. PATENT DOCUMENTS

| | | |
|---|---|---|
| 9,356,402 B2 * | 5/2016 | Sung .................. H01R 13/6585 |
| 9,535,106 B2 | 1/2017 | Li |
| 9,547,047 B2 | 1/2017 | Li et al. |
| 9,564,119 B2 * | 2/2017 | Ryu .................... G10L 21/0364 |
| 9,697,926 B2 * | 7/2017 | Huang ................. H01B 7/0823 |
| 2012/0119918 A1 | 5/2012 | Williams |
| 2014/0117995 A1 | 5/2014 | Topucharla |
| 2017/0222425 A1 | 8/2017 | Li et al. |

* cited by examiner

LEAKAGE CURRENT DETECTION AND PROTECTION DEVICE FOR POWER CORD

BACKGROUND OF THE INVENTION

Field of the Invention

This invention relates to electrical apparatus, and in particular, it relates to a leakage current detection and protection device for a power cord.

Description of Related Art

A leakage current detection and protection device for a power cord is a safety device that can prevent fire caused by electrical apparatus. It is implemented in a power cord that has a plug, and functions to detect leakage currents that may occur between the hot line, the neutral line, and the shield layer of the power cord that extend between the plug and the load (e.g. electrical appliances such as air conditioner, dehumidifier, etc.). Upon detecting a leakage current, the device cuts off the power supply, thereby preventing fire and ensuring safety. The device can prevent fire caused by arc fault which can result from damage of the insulation in the hot, neutral, and ground lines of the power cord due to aging, wear, pinch, animal chewing, etc.

A leakage current detection and protection device for a power cord that can detect improper insulation of the power cord is needed.

SUMMARY

Accordingly, the present invention is directed to a device and related method that uses a signal feedback line to detect whether the shield line has an open circuit, and introduces a open circuit detection unit to automatically detect the shield line open circuit condition.

In one aspect, the present invention provides a power cord leakage current detection and protection device, which includes: a switch unit configured to control an electrical connection between an input end and an output end of the device; a leakage current protection unit, which includes a switch drive module and a leakage current detection module, the switch drive module configured to control the switch unit based on a leakage current signal detected by the leakage current detection module, wherein the leakage current detection module includes a leakage current detection line configured to detect whether a leakage current is present on a first power supply line and/or a second power supply line, and a signal feedback line configured to detect whether the leakage current detection line has an open circuit; and a test unit, including a test switch, coupled to the a leakage current protection unit, wherein when the test switch is closed, the switch drive module controls the switch unit based on a signal on the signal feedback line.

Using the above embodiment, when the test switch is closed, by determining whether a test signal is supplied to the switch drive module, it can be determined whether the test signal circuit has an open circuit.

In one embodiment, at least the test unit and the leakage current protection unit form a first test current loop, wherein when the test switch is closed, the switch drive module controls the switch unit to disconnect the electrical connection.

Using this embodiment, when the leakage current detection line or the signal feedback line of the power cord has an open circuit, depressing the test switch is ineffective and the trip mechanism does not cut off the power supply. This way, the user can see whether the device is operating normally.

In one embodiment, the device further includes an open circuit detection unit, which includes a first detection module and a second detection module, wherein the signal feedback line is coupled via the first detection module to one of the first power supply line and the second power supply line, and the leakage current detection line is coupled via the second detection module to another one of the first power supply line and the second power supply line; and wherein at least the first detection module and the leakage current protection unit form a second test current loop, the second test current loop configured to cause the switch drive module to control the switch unit to disconnect the electrical connection when at least one of the first detection module, the leakage current detection line and the signal feedback line has an open circuit.

Using this embodiment, when the leakage current detection line or the signal feedback line has an open circuit, by the detection of the first detection module and the second detection module, the power supply is cut off. Also, when the first detection module has an open circuit, and the leakage current detection line and/or the signal feedback line has an open circuit, depressing the test switch is ineffective and the trip mechanism does not cut off the power supply.

In one embodiment, the first detection module includes a first resistor and a first diode connected in series, and the second detection module includes a second resistor and a second diode connected in series.

In one embodiment, the device further includes a housing, for accommodating at least one of the switch unit, the leakage current protection unit, the test unit and the open circuit detection unit.

In a second aspect, the present invention provides a power cord leakage current detection and protection device, which includes: a switch unit, configured to control electrical connection between an input end and an output end of the device; a leakage current protection unit, which includes a switch drive module and a leakage current detection module, the switch drive module configured to control the switch unit based on a leakage current signal detected by the leakage current detection module, wherein the leakage current detection module includes a leakage current detection line configured to detect whether a leakage current is present on a first power supply line and/or a second power supply line; and an open circuit detection unit, which includes a first detection module and a second detection module, wherein the leakage current detection line is coupled via the first detection module to one of the first power supply line and the second power supply line, and the second detection module is coupled to another one of the first power supply line and the second power supply line; wherein at least the first detection module and the leakage current protection unit form a test current loop, the test current loop configured to cause the switch drive module to control the switch unit to disconnect the electrical connection when the first detection module and/or the leakage current detection line has an open circuit.

In one embodiment, the first detection module includes a first resistor and a first diode connected in series, and the second detection module includes a second resistor and a second diode connected in series.

In one embodiment, the device further includes a signal feedback line, wherein the leakage current detection line is coupled via the signal feedback line to the first detection module, wherein the first detection module is located at a distance away from the output end. This way, the first detection module can be located in the housing of the plug.

In one embodiment, the device further includes a housing, for accommodating at least one of the switch unit, the leakage current protection unit, and the open circuit detection unit.

In a third aspect, the present invention provides an electrical appliance that employs the above power cord leakage current detection and protection device.

Embodiments of the present invention not only achieve manual testing of the shield line, they can also automatically detect the shield line open circuit condition during use of the device, thereby improving safety. Embodiments of the invention have the additional advantage of simple circuitry and low cost.

BRIEF DESCRIPTION OF THE DRAWINGS

The following drawings are used to describe the embodiments. These drawings explain the principles of the invention, and only illustrate the structures that are necessary for understanding the invention. The drawings are not necessarily to scale. In the multiple drawings, the same or similar reference symbols denote the same or similar structures.

DETAILED DESCRIPTION OF PREFERRED EMBODIMENTS

Embodiments of the invention are described below with reference to the drawings. The drawings illustrate specific embodiment that can achieve the goals of the present invention. The illustrated embodiments are not intended to show all possible embodiments of the invention. It should be understood that other embodiments can be constructed without departing from the spirit of the invention, and the illustrated embodiments may be modified structurally or logically. Thus, the detailed descriptions below are limiting, and the scope of the invention should be determined by the appended claims.

Figure 1:
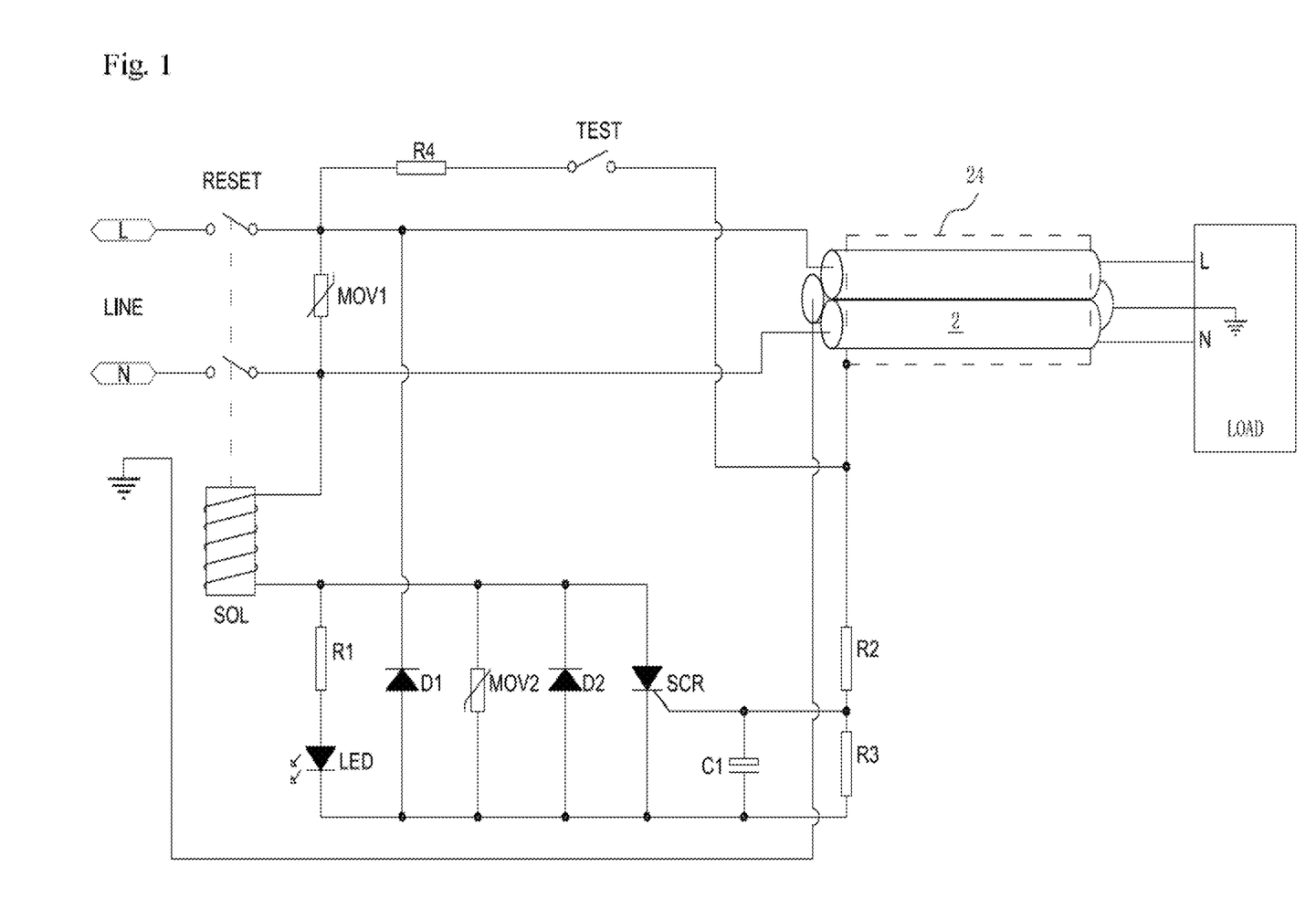
FIG. 1 illustrates a conventional LCDI (leakage current detection and interruption) device.

FIG. 1 illustrates a conventional LCDI (leakage current detection and interruption) device. Through experiments and analyses, the inventors discovered various shortcomings of the conventional LCDI device:

First, as a protection device, technical standards require the device to have a reset switch RESET and a test switch TEST. The reset switch RESET is used to make or break power connection, and the test switch TEST is used to test whether the protection function of the device is operating normally. From time to time during use, the user needs to operate the test switch TEST and the reset switch RESET, to determine whether the device is functioning normally. However, in conventional LCDI devices, the test switch TEST can only detect whether the internal circuit and the trip mechanism inside the plug are normal, and cannot detect whether the leakage current detection function of the leakage current detection line (the shield line) of the power cord, which is external to the plug and extends to the load, is normal. When the leakage current detection line of the power cord has an open circuit, even when the user operates the test switch TEST and the reset switch RESET and they show normal functioning, the device may still have lost its leakage current protection function. This posts a hidden threat to safety.

Further, conventional LCDI typically uses 35% copper woven line and aluminum foil covered current carrying wire as the shield line. During use of the power cord, because the cord is subject to moving, bending, pinch, aging, animal chewing, etc., the shield line which functions as a leakage current detector can become an open circuit. This causes the LCDI device to lose its leakage current projection function. Even if operating the test switch TEST and the reset switch RESET can detect whether the shield line has an open circuit, the user typically will not frequently operate the test switch TEST and the reset switch RESET during use. Thus, there is still a safety threat.

Embodiments of the present invention provide a power cord leakage current detection and protection device. The device uses a signal feedback line to detect and monitor whether the leakage current detection line (the shield line) of the power cord has an open circuit. Thus, by operating the test switch TEST, the user can determine whether the leakage current detection line has an open circuit (i.e. disconnected). Further, the device includes an open-circuit detection unit, for detecting and monitoring whether the leakage current detection line of the power cord has an open circuit; when it has an open circuit, the device automatically cuts off the power supply, to ensure safety of the electrical appliance.

Figure 2:
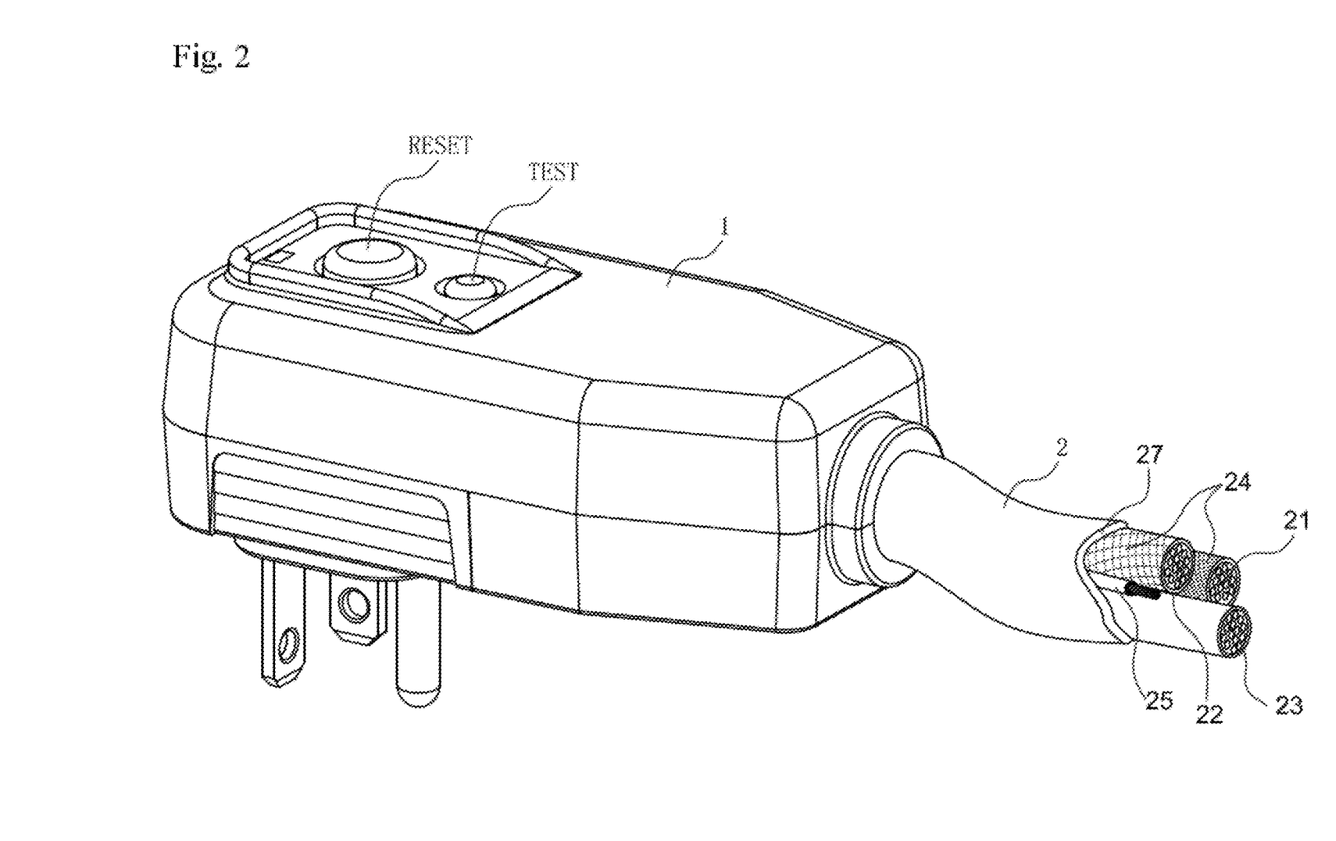
FIG. 2 is an exterior view of a power plug according to embodiments of the present invention.

As shown in FIG. 2, the power cord leakage current detection and protection device has a plug 1 that includes a switching unit, and an external power cord 2. The plug 1 includes a test switch TEST and a reset switch RESET. In the embodiment shown in FIG. 2, the power cord 2 includes a hot line (L) 21, a neutral line (N) 22, a ground line (G) 23, a leakage current detection line (shield line) 24, a signal feedback line 25, and an insulating cover 27. The signal feedback line 25 is a conductor having its own insulating layer, and can be disposed at any position of the power cord 2. The exterior cross-section of the power cord 2 may be round, or may be a linear array of parallel wires, or other shapes. It should be understood that in other embodiment, the power cord 2 may include other signal lines.

Figure 3:
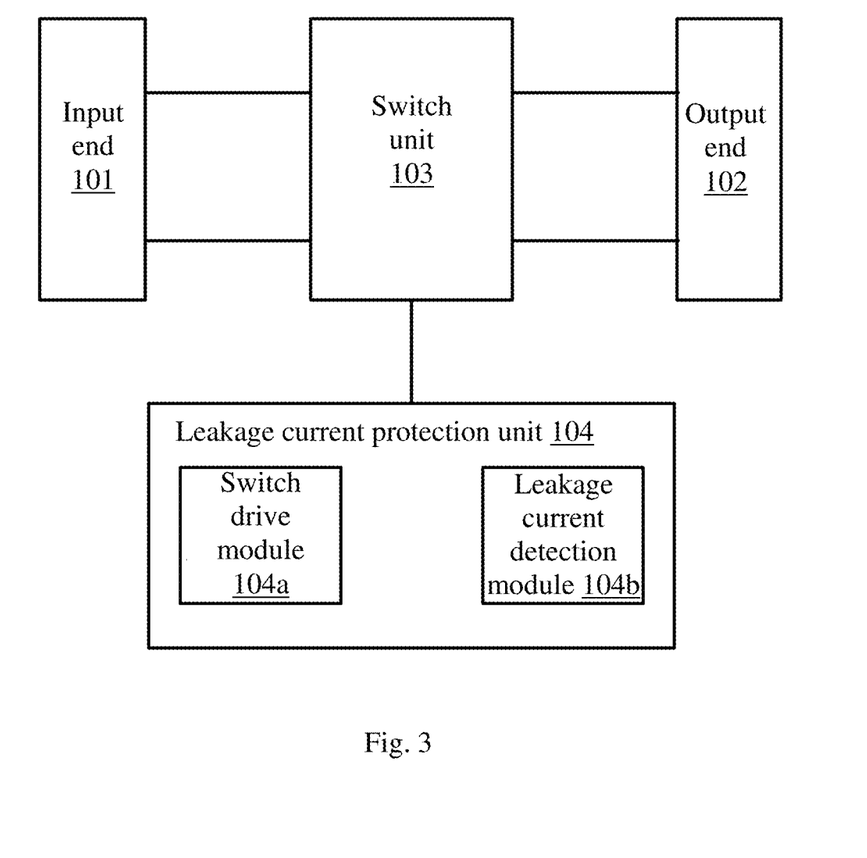
FIG. 3 is a block diagram showing a leakage current detection and protection device for a power cord according to an embodiment of the present invention.

FIG. 3 is a block diagram showing a power cord leakage current detection and protection device according to an embodiment of the present invention. The power cord leakage current detection and protection device 10 includes: a switch unit 103, configured to control the electrical connection and disconnection between the input end 101 and the output end 102; a leakage current protection unit 104, which includes a switch drive module 104a and a leakage current detection module 104b. The switch drive module 104a is configured to control the switch unit 103 based on the leakage current signal detected by the leakage current detection module 104b. More specifically, the leakage current detection module 104b includes the leakage current detection line, configured to detect whether a leakage current is present on the first power supply line and/or the second power supply line; and a signal feedback line, configured to detect whether the leakage current detection line has an open circuit. The power cord leakage current detection and protection device further includes a test switch TEST coupled to the signal feedback line. When the test switch TEST is closed (connected), the switch drive module 104a controls the switch unit 103 based on the signal on the signal feedback line.

Figure 4:
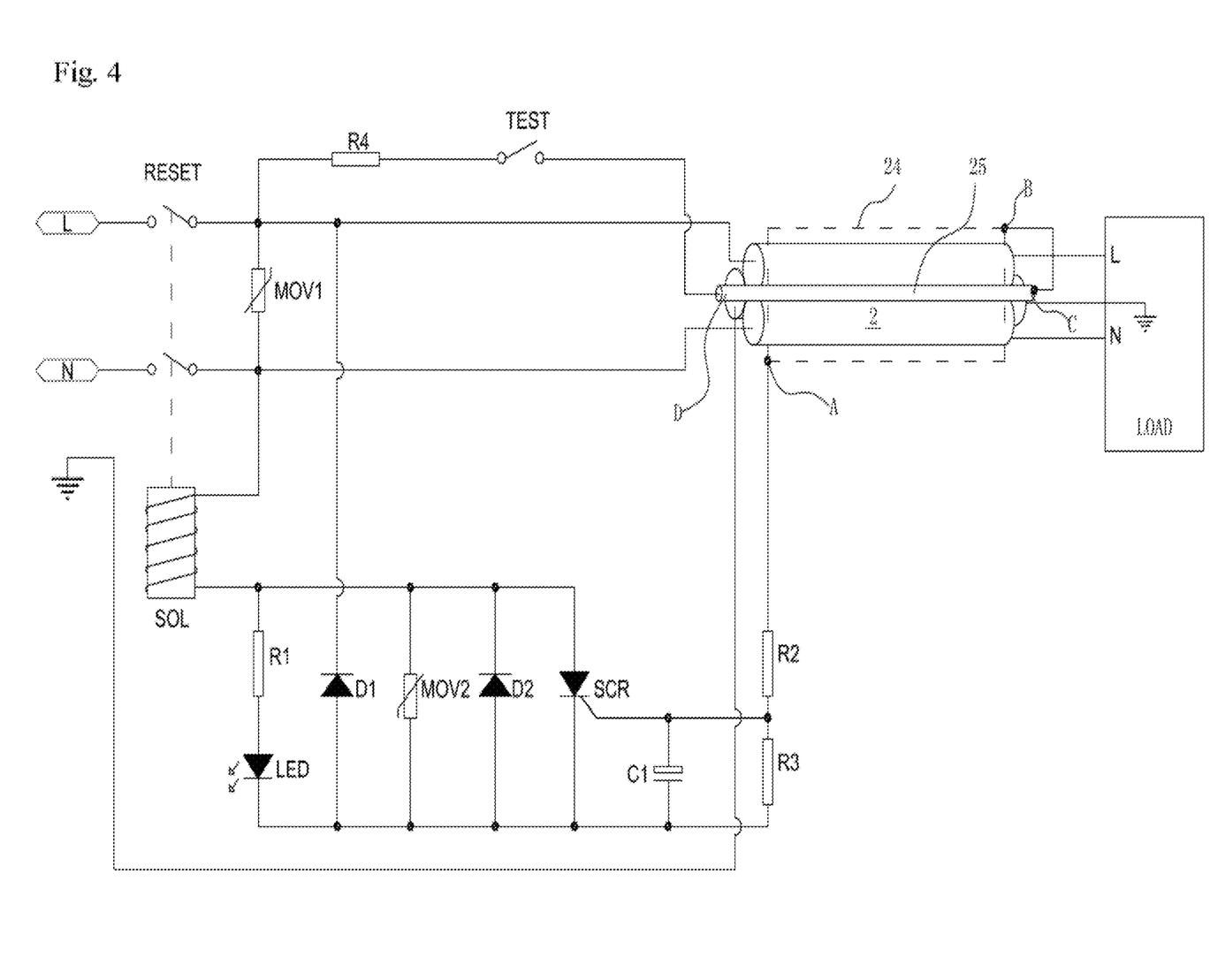
FIG. 4 is a circuit diagram of a leakage current detection and protection device according to a first embodiment of the present invention.

FIG. 4 is a circuit diagram of a leakage current detection and protection device according to a first embodiment of the present invention. As shown in FIG. 4, the leakage current detection line 24 of the power cord 2 is coupled at one end A to a control circuit R2, and coupled at the other end B to one end C of the signal feedback line 25. The other end D of the signal feedback line 25 is coupled to the test switch TEST. Thus, the test switch TEST is coupled to the leakage current detection line 24 via the signal feedback line 25.

When the test switch TEST is depressed, a simulated leakage current flows from the hot line L through a resistor R4, the test switch TEST, the signal feedback line 25, the leakage current detection line 24, resistors R and R3, a diode D2, a solenoid SOL to the neutral line N, forming a test current loop. The simulated leakage current causes the voltage across the resistor R3 to rise, which drives the silicon controlled rectifier SCR to become conductive. From FIG. 4 it can be seen that when the SCR is conductive, a trip current loop is formed from the neutral line N, the solenoid SOL, the silicon controlled rectifier SCR, and the diode D1 to the hot line L. Thus, a relatively large current flows through the solenoid SOL, so it generates a sufficiently large magnetic field, causing the reset switch RESET to trip which cuts off the power. If any component or lines in the test current loop is open, the device will not trip when the test switch TEST is depressed. Thus, the user can operate the test switch TEST to detect whether the leakage current detection line 24 is intact. It can also be seen that depending on the applications, the same structure and operation can be used to detect abnormal conditions of any of the components of the test current loop.

Figure 5:
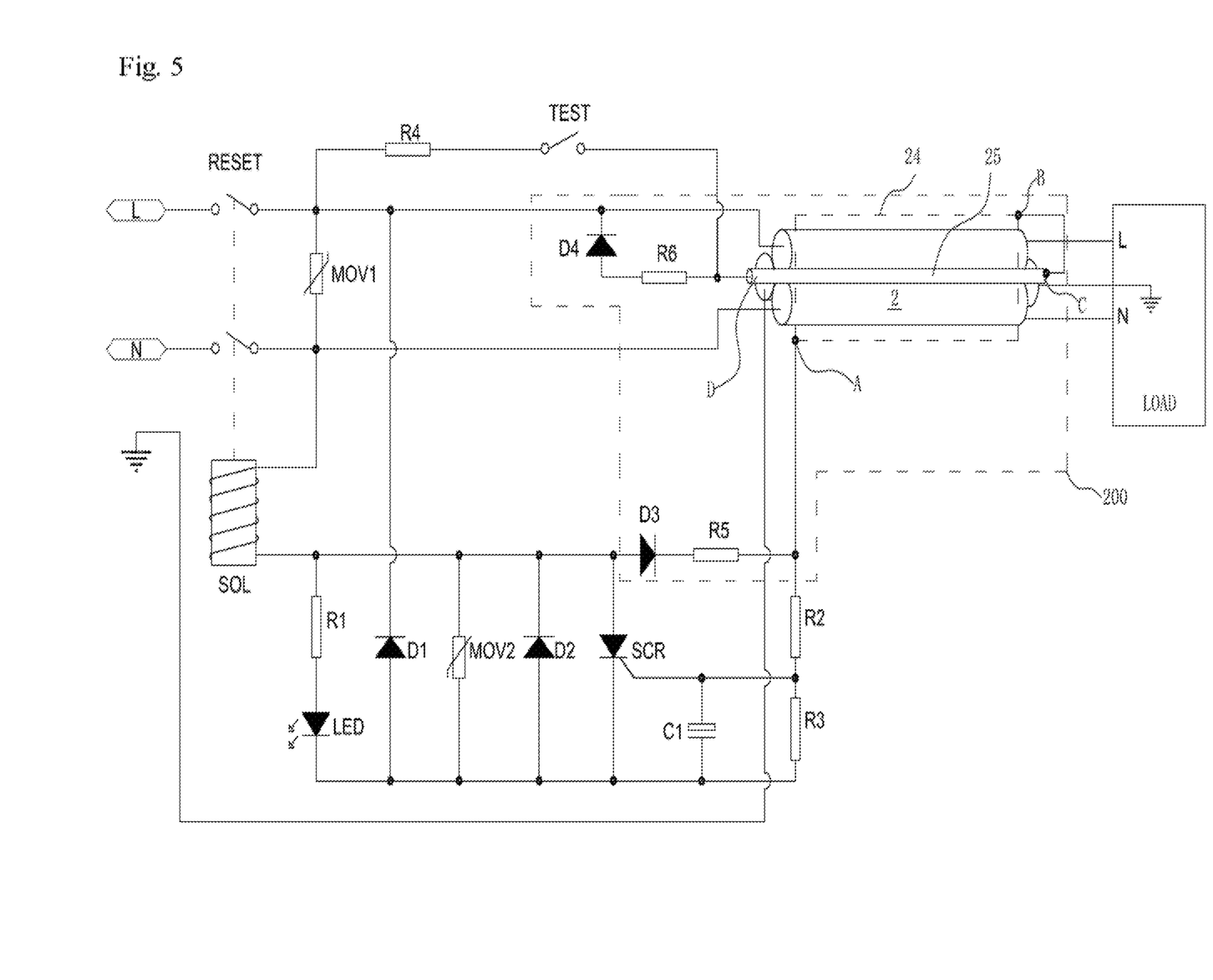
FIG. 5 is a circuit diagram of a leakage current detection and protection device according to a second embodiment of the present invention.

FIG. 5 is a circuit diagram of a leakage current detection and protection device according to a second embodiment of the present invention. Compared to the device of FIG. 4, the power cord leakage current detection and protection device of FIG. 5 additionally includes an open circuit detection unit 200. As shown in FIG. 5, the open circuit detection unit 200 includes a first detection module (D3, R5) and a second detection module (D4, R6). The leakage current detection line 24 of the power cord 2 is coupled at one end A to the control circuit R2, and coupled at the other end B to one end C of the signal feedback line 25. The other end D of the signal feedback line 25 is coupled to the test switch TEST. Thus, the test switch TEST is coupled to the leakage current detection line 24 via the signal feedback line 25. Further, the other end D of the signal feedback line 25 is also coupled to the hot line L via the second detection module. The neutral line N is coupled via the solenoid SOL and the first detection module to the first end A of the leakage current detection line 24.

When the leakage current detection line 24 is operating normally (not an open circuit), by setting the resistors R5 and R6, the point A is limited to a relatively low voltage, so the silicon controlled rectifier SCR is not triggered to conduct, and the device operates normally. But when any location along the leakage current detection line 24 has an open circuit, a current loop is formed from the neutral line N, via the solenoid SOL, the diode D3, the resistor R5, the resistor R2, the resistor R3, the diode D1, to the hot line L. The voltage across the resistor R3 will rise, which triggers the silicon controlled rectifier SCR to become conductive. When the silicon controlled rectifier SCR, the solenoid SOL, and the diode D1 form a current loop, the solenoid SOL generates a magnetic field to cause the reset switch RESET to trip, which cuts off the power.

Similarly, when any of the diode D4, the resistor R6, and the signal feedback line 25 has an open circuit, the power can be cut off.

Thus, the power cord leakage current detection and protection device of FIG. 5 can automatically detect an open circuit condition of any one of the signal feedback line 25, the diode D4, the resistor R6, and the signal feedback line 25.

Figure 6:
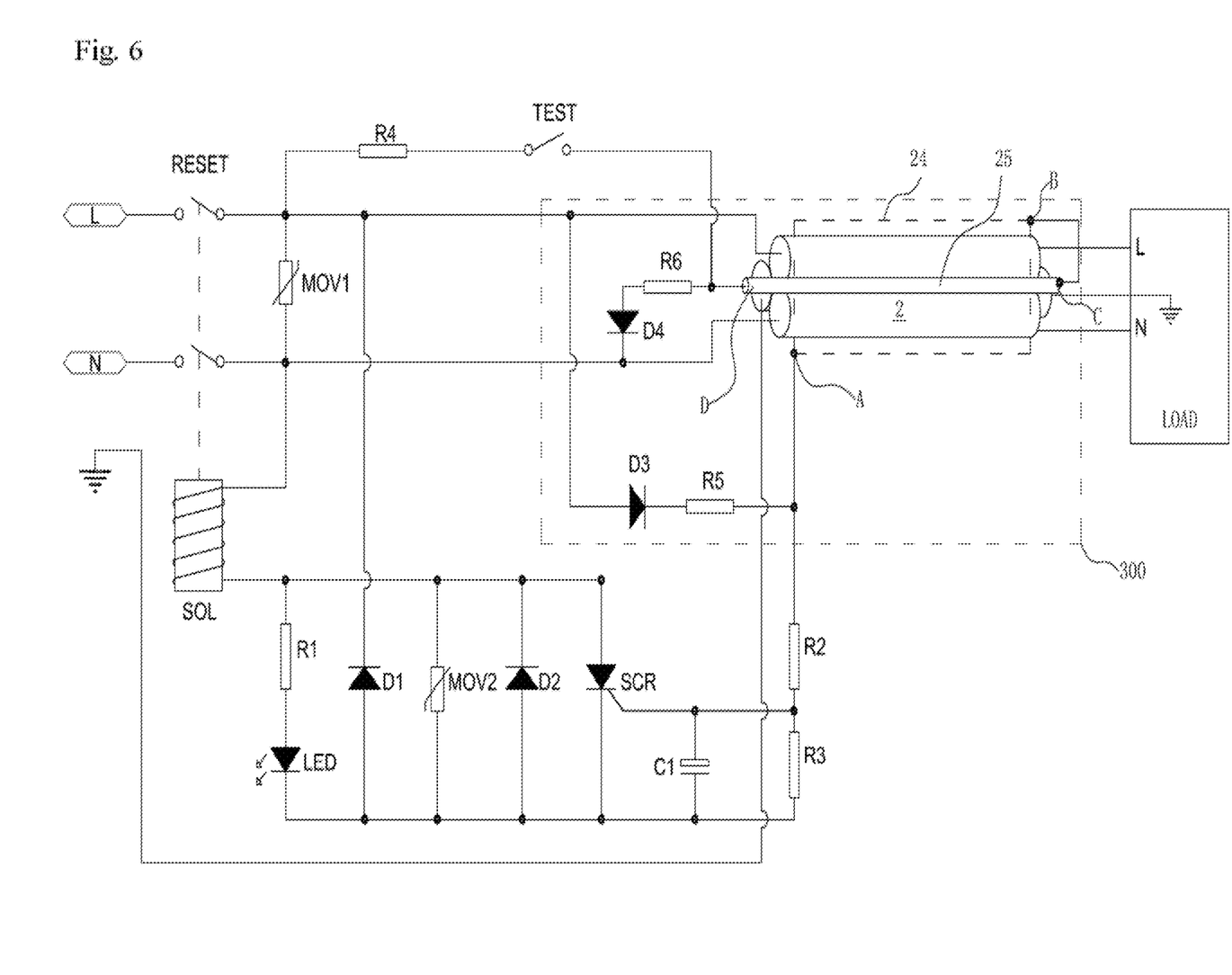
FIG. 6 is a circuit diagram of a leakage current detection and protection device according to a third embodiment of the present invention.

FIG. 6 is a circuit diagram of a leakage current detection and protection device according to a third embodiment of the present invention. Similar to the device of FIG. 5, the power cord leakage current detection and protection device of FIG. 6 includes an open circuit detection unit 300. When the leakage current detection line 24 is operating normally, by voltage division of the resistors R5 and R6, the point A is limited to a relatively low voltage, so the silicon controlled rectifier SCR is not triggered to conduct, and the device operates normally. But when any location along the leakage current detection line 24 has an open circuit, a current loop is formed from the hot line L, via the diode D3, the resistor R5, the resistor R2, the resistor R3, the diode D2, and the solenoid SOL, to the neutral line N. The voltage across the resistor R3 will rise, which triggers the silicon controlled rectifier SCR to become conductive. Thus, the solenoid SOL generates a magnetic field to cause the reset switch RESET to trip, which cuts off the power. Thus, the power cord leakage current detection and protection device of FIG. 6 can automatically detect an open circuit condition of the leakage current detection line 24.

Embodiments of the present invention provides another power cord leakage current detection and protection device, which includes: a switch unit 103, configured to control the electrical connection and disconnection between the input end 101 and the output end 102; a leakage current protection unit 104, which includes a switch drive module 104a and a leakage current detection module 104b. The switch drive module 104a is configured to control the switch unit 103 based on the leakage current signal detected by the leakage current detection module 104b. More specifically, the leakage current detection module 104b includes the leakage current detection line and an open circuit detection unit. The leakage current detection line is configured to detect whether a leakage current is present on the first power supply line and/or the second power supply line. The open circuit detection unit includes a first detection module and a second detection module, where the first power supply line is coupled via the first detection module, the leakage current detection line and the second detection module to the second power supply line. The power cord leakage current detection and protection device further includes a test switch TEST coupled to the leakage current detection line. When the test switch TEST is closed, the switch drive module 104*a* controls the switch unit 103 to cut off power supply. Specific embodiments are described with reference to FIGS. 7-10.

Figure 7:
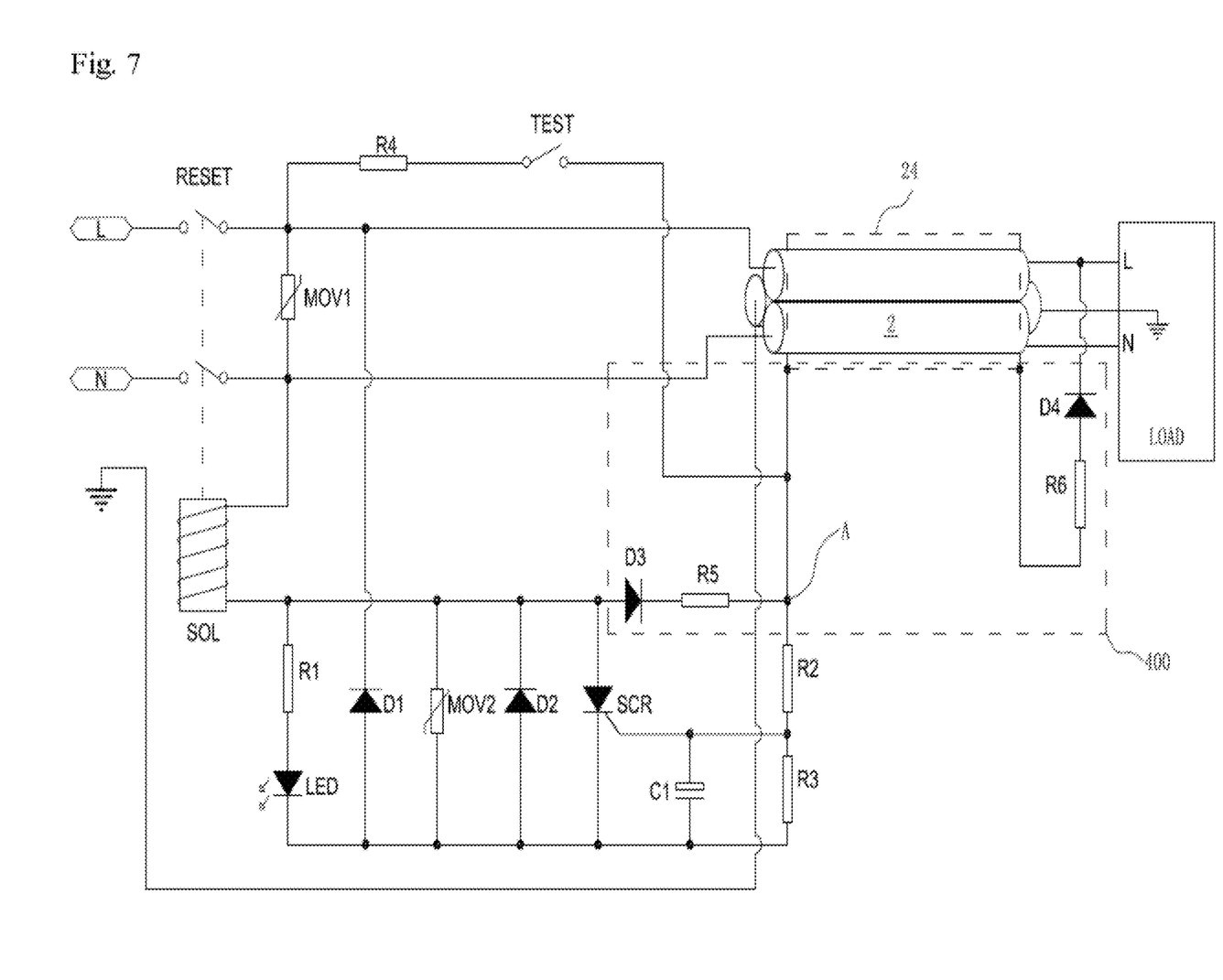
FIG. 7 is a circuit diagram of a leakage current detection and protection device according to a fourth embodiment of the present invention.

FIG. 7 is a circuit diagram of a leakage current detection and protection device according to a fourth embodiment of the present invention. As shown in FIG. 7, the open circuit detection unit 400 includes a first detection module (D3, R5) and a second detection module (D4, R6). The first detection module is coupled between the neutral line N and the shield line (leakage current detection line) 24, and the second detection module is coupled between the shield line 24 and the hot line L. When the shield line 24 has no open circuit, the point A is limited to a relatively low voltage, so the silicon controlled rectifier SCR is not triggered to conduct, and the device operates normally. But when any location along the shield line 24 has an open circuit, a current loop is formed between the neutral line N and the hot line L, via the solenoid SOL, the diode D3, the resistors R5, R2 and R3, and the diode D1. This current loop triggers the silicon controlled rectifier SCR to become conductive; therefore, the silicon controlled rectifier SCR, the solenoid SOL, and the diode D1 form a current loop. As a result, the solenoid SOL generates a magnetic field to cause the device to trip, which cuts off the power. This achieves automatic detection of open circuit conditions of the leakage current detection line 24.

Figure 8:
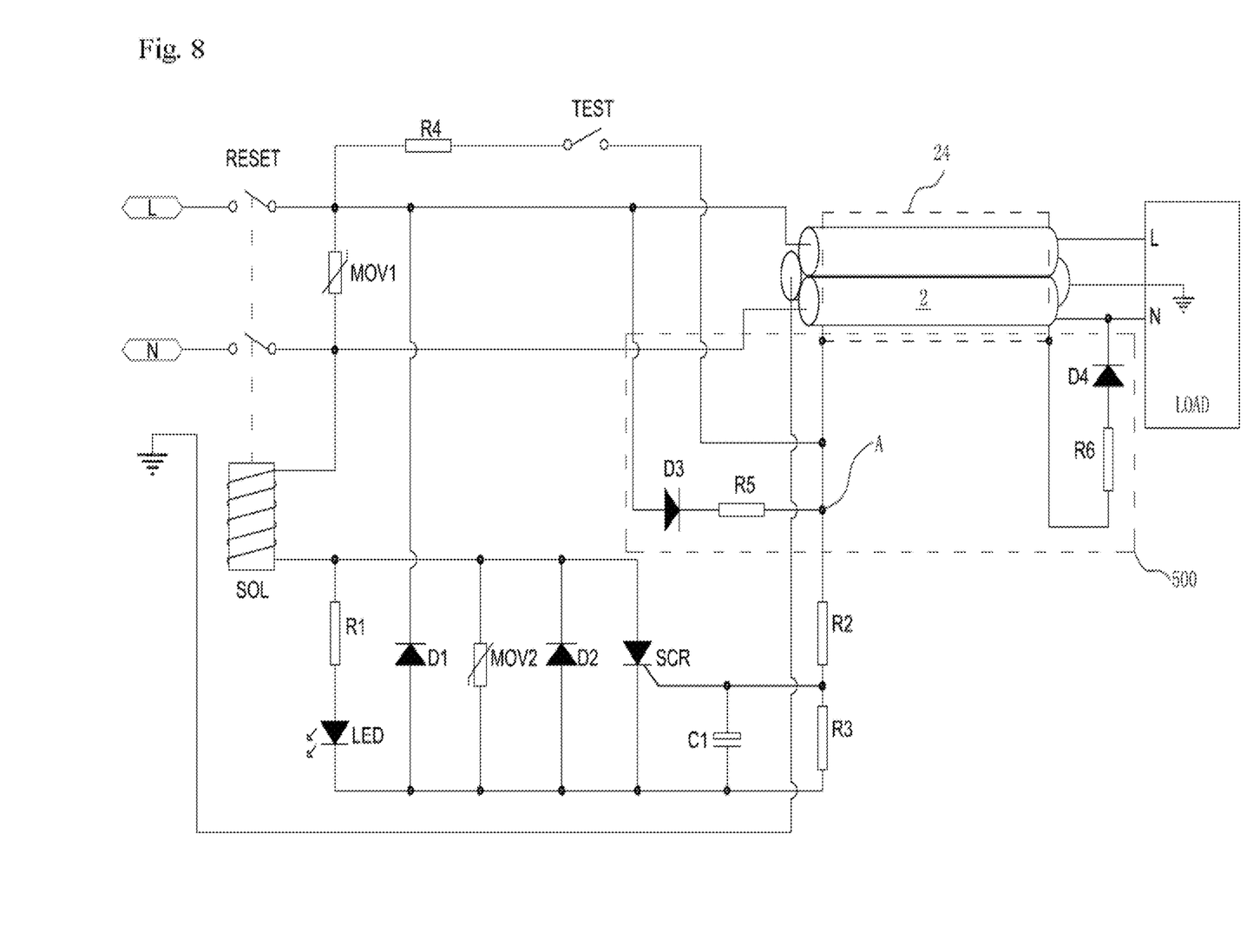
FIG. 8 is a circuit diagram of a leakage current detection and protection device according to a fifth embodiment of the present invention.

FIG. 8 is a circuit diagram of a leakage current detection and protection device according to a fifth embodiment of the present invention. Similar to the device of FIG. 7, the power cord leakage current detection and protection device of FIG. 8 includes an open circuit detection unit 500. When any location along the leakage current detection line 24 has an open circuit, a current loop is formed from the hot line L, via the diode D3, the resistor R5, the resistor R2, the resistor R3, the diode D2, and the solenoid SOL, to the neutral line N. This triggers the silicon controlled rectifier SCR to become conductive, which in turn causes the solenoid SOL to generate a magnetic field to cause the device to trip, which cuts off the power. This achieves automatic detection of open circuit conditions of the shield line 24.

Figure 9:
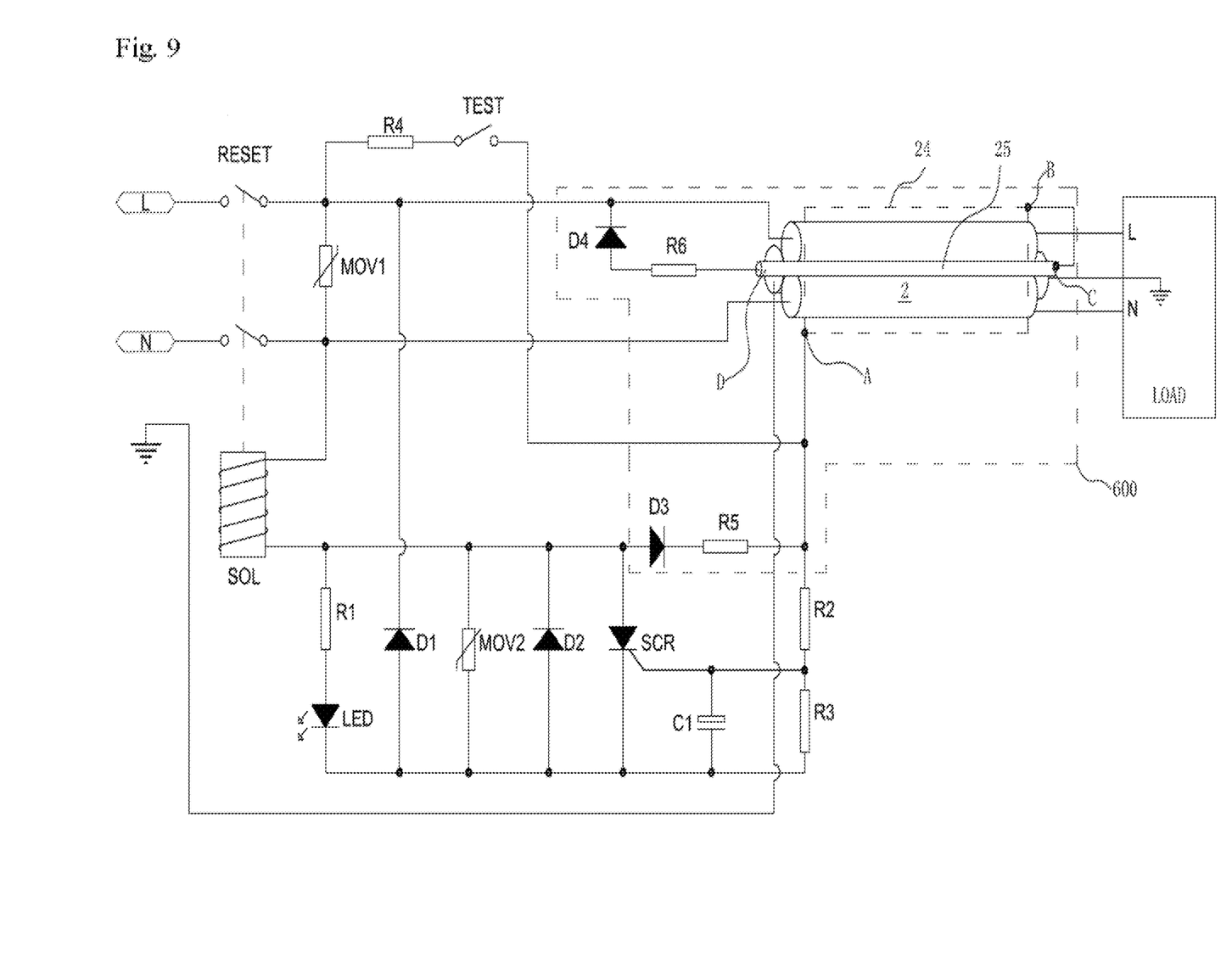
FIG. 9 is a circuit diagram of a leakage current detection and protection device according to a sixth embodiment of the present invention.

FIG. 9 is a circuit diagram of a leakage current detection and protection device according to a sixth embodiment of the present invention. Compared to the device of FIG. 7, the open circuit detection unit 600 in FIG. 9 additionally includes a signal feedback line 25. The second detection module can be coupled via the signal feedback line 25 to any point on the hot line L. Thus, the resistor R6 and the diode D4 may be located inside the housing of the plug 1.

Figure 10:
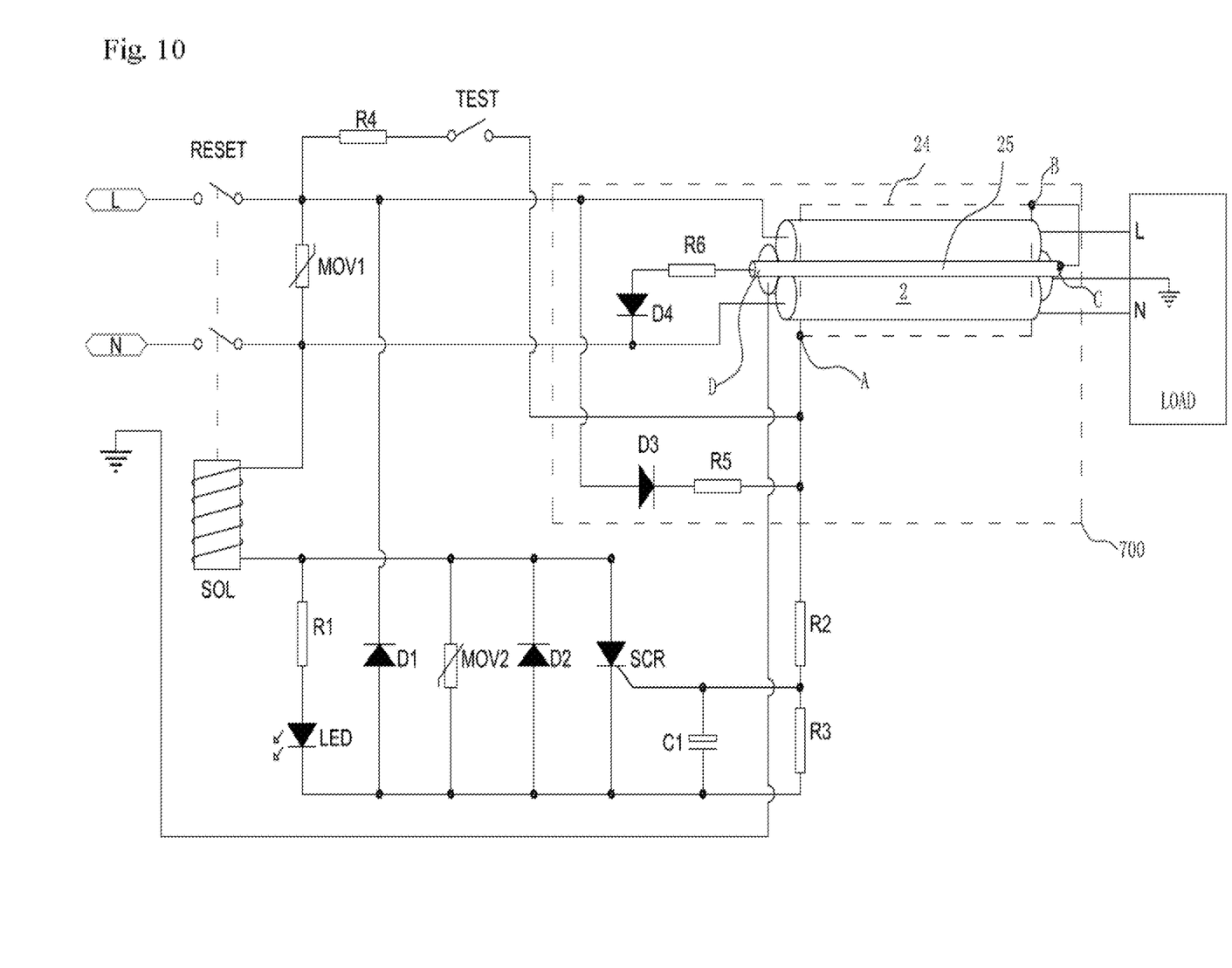
FIG. 10 is a circuit diagram of a leakage current detection and protection device according to a seventh embodiment of the present invention.

FIG. 10 is a circuit diagram of a leakage current detection and protection device according to a seventh embodiment of the present invention. Compared to the device of FIG. 8, the open circuit detection unit 700 in FIG. 10 additionally includes a signal feedback line 25. The second detection module can be coupled via the signal feedback line 25 to any point on the hot line L. Thus, the resistor R6 and the diode D4 may be located inside the housing of the plug 1.

Embodiments of the present invention not only achieve testing of the shield line by manually operating the test switch TEST, they can also automatically detect the shield line open circuit condition during use of the device, thereby improving safety. Embodiments of the invention have the additional advantage of simple circuitry and low cost.

It will be apparent to those skilled in the art that various modification and variations can be made in the power cord leakage current detection and protection device and related method of the present invention without departing from the spirit or scope of the invention. Thus, it is intended that the present invention cover modifications and variations that come within the scope of the appended claims and their equivalents.

What is claimed is:

1. A power cord leakage current detection and protection device, comprising:
   a switch unit, configured to control an electrical connection between an input end and an output end of the device;
   a leakage current protection unit, which includes a switch drive module and a leakage current detection module, the switch drive module configured to control the switch unit based on a leakage current signal detected by the leakage current detection module, wherein the leakage current detection module includes:
      a leakage current detection line, configured to detect whether a leakage current is present on a first power supply line and/or a second power supply line; and
      a signal feedback line, configured to detect whether the leakage current detection line has an open circuit; and
   a test unit, including a test switch, coupled to the a leakage current protection unit, wherein when the test switch is closed, the switch drive module controls the switch unit based on a signal on the signal feedback line.

2. The power cord leakage current detection and protection device of claim 1, wherein at least the test unit and the leakage current protection unit form a first test current loop, wherein when the test switch is closed, the switch drive module controls the switch unit to disconnect the electrical connection.

3. The power cord leakage current detection and protection device of claim 1, further comprising:
   an open circuit detection unit, which includes a first detection module and a second detection module, wherein the signal feedback line is coupled via the first detection module to one of the first power supply line and the second power supply line, and the leakage current detection line is coupled via the second detection module to another one of the first power supply line and the second power supply line; and
   wherein at least the first detection module and the leakage current protection unit form a second test current loop, the second test current loop configured to cause the switch drive module to control the switch unit to disconnect the electrical connection when at least one of the first detection module, the leakage current detection line and the signal feedback line has an open circuit.

4. The power cord leakage current detection and protection device of claim 3, wherein the first detection module includes a first resistor and a first diode connected in series, and the second detection module includes a second resistor and a second diode connected in series.

5. The power cord leakage current detection and protection device of claim 3, further comprising:
   a housing, for accommodating at least one of the switch unit, the leakage current protection unit, the test unit and the open circuit detection unit.

6. A power cord leakage current detection and protection device, comprising:
   a switch unit, configured to control electrical connection between an input end and an output end of the device;
   a leakage current protection unit, which includes a switch drive module and a leakage current detection module, the switch drive module configured to control the switch unit based on a leakage current signal detected by the leakage current detection module, wherein the leakage current detection module includes:
- a leakage current detection line, configured to detect whether a leakage current is present on a first power supply line and/or a second power supply line; and
- an open circuit detection unit, which includes a first detection module and a second detection module, wherein the leakage current detection line is coupled via the first detection module to one of the first power supply line and the second power supply line, and the second detection module is coupled to another one of the first power supply line and the second power supply line;

wherein at least the first detection module and the leakage current protection unit form a test current loop, the test current loop configured to cause the switch drive module to control the switch unit to disconnect the electrical connection when the first detection module and/or the leakage current detection line has an open circuit.

7. The power cord leakage current detection and protection device of claim 6, wherein the first detection module includes a first resistor and a first diode connected in series, and the second detection module includes a second resistor and a second diode connected in series.

8. The power cord leakage current detection and protection device of claim 7, further comprising:
- a signal feedback line, wherein the leakage current detection line is coupled via the signal feedback line to the first detection module, wherein the first detection module is located at a distance away from the output end.

9. The power cord leakage current detection and protection device of claim 6, further comprising:
- a housing, for accommodating at least one of the switch unit, the leakage current protection unit, and the open circuit detection unit.

10. An electrical appliance, comprising the power cord leakage current detection and protection device of claim 1.

11. An electrical appliance, comprising the power cord leakage current detection and protection device of claim 6.

* * * * *